(12) United States Patent
McEachern et al.

(10) Patent No.: US 10,139,434 B1
(45) Date of Patent: Nov. 27, 2018

(54) METHOD AND APPARATUS FOR MEASURING THE STABILITY OF AN ALTERNATING CURRENT DISTRIBUTION GRID

(71) Applicant: Power Standard Lab Inc., Alameda, CA (US)

(72) Inventors: Alexander McEachern, Oakland, CA (US); David Stanley Watson, San Anselmo, CA (US); Charles Patrick McParland, Berkeley, CA (US)

(73) Assignee: Power Standard Lab Inc., Alameda, CA (US)

( * ) Notice: Subject to any disclaimer, the term of this patent is extended or adjusted under 35 U.S.C. 154(b) by 0 days.

(21) Appl. No.: 15/874,750

(22) Filed: Jan. 18, 2018

(51) Int. Cl.
*G01R 19/25* (2006.01)

(52) U.S. Cl.
CPC ................. *G01R 19/2513* (2013.01)

(58) Field of Classification Search
CPC .................................. G01R 19/2513
See application file for complete search history.

(56) References Cited

U.S. PATENT DOCUMENTS

| | | | |
|---|---|---|---|
| 6,759,765 | B2 | 7/2004 | McEachern et al. |
| 7,116,010 | B2 | 10/2006 | Lasseter et al. |
| 9,621,569 | B1 | 4/2017 | McEachern et al. |
| 2007/0241759 | A1 | 10/2007 | Williams |
| 2012/0226385 | A1 | 9/2012 | Trudnowski et al. |

FOREIGN PATENT DOCUMENTS

EP 2 728 697 A2 7/2014

OTHER PUBLICATIONS

Hatano et al.,"Results of Lightning Impulse Tests for a 275-kV Full GIS Substation," 2004, Wiley Periodicals, Inc, vol. 146, No. 1, 46-58.*
Sandia Report, Raymond H. Byrne et al.,Prepared by Sandia National Labratories, Albuquerque, New Mexico, 87185, Printed Dec. 2012, 227 pages.
IEEE Recommended Practice and Requirements for Harmonic Control in Electric Power Systems, The Institute of Electrical and Electronics Engineers, Inc.3 Park Avenue, New York, NY 10016-5997, USA Copyright © 2014 by The Institute of Electrical and Electronics Engineers, Inc. All rights reserved. Published Jun. 11, 2014. Printed in the United States of America., 17 pages.

(Continued)

*Primary Examiner* — Janet L Suglo
(74) *Attorney, Agent, or Firm* — Haverstock & Owens LLP

(57) ABSTRACT

A system measures the stability of a live a.c. power distribution grid, without disrupting sensitive loads on that grid. The system applies repetitive time-synchronized loads to create current pulses, and resulting voltage instabilities, on the grid. The current pulses are sized to ensure that the resulting voltage instabilities are too small to affect the sensitive loads. Time-synchronized voltage measurement devices record the voltage instabilities. The time synchronization, and the repetitive nature of the current pulses, allow the voltage instabilities caused by the current pulses to be extracted from the larger background voltage variations.

16 Claims, 7 Drawing Sheets

(56) References Cited

OTHER PUBLICATIONS

Apollo 16—Preliminary Science Report, Prepared by NASA Manned Spacecraft Center, Science and Technical Information Office, National Aeronautics and Space Administration, 1972, 17 pages.
IEC 77A/873/FDIS, Final Draft International Standard Projet Final, Distibuted: Nov. 7, 2014, Copyright 2014 International Electrotechnical Commission70 Pages.
Semi F47-0706, Specification for Semiconductor Processing Equipment Voltage Sag Immunity, Copyright by SEMI Semiconductor Equipment and Materials International, 3081 Zanker Road, San Jose, CA 95134, 10 pages.
Bonneville Power Administrction 1400-MW Braking Resistor, M.L. Shelton et al., Portland,Oregon, pp. 602-614.

\* cited by examiner

METHOD AND APPARATUS FOR MEASURING THE STABILITY OF AN ALTERNATING CURRENT DISTRIBUTION GRID

STATEMENT REGARDING FEDERALLY SPONSORED RESEARCH OR DEVELOPMENT

The invention disclosed herein was conceived and developed, in part, during work on RADICS (Rapid Attack Detection, Isolation and Characterization Systems) program subcontract FA875016C0175 sponsored by the U.S. Department of Defense DARPA (Defense Advanced Research Projects Agency) Agency.

CROSS-REFERENCE TO RELATED APPLICATIONS

Not Applicable

REFERENCE TO SEQUENCE LISTING, A TABLE, OR A COMPUTER PROGRAM LISTING COMPACT DISK APPENDIX

Not Applicable

BACKGROUND OF THE INVENTION

The present invention is in the technical field of measurement of electric parameters.

More particularly, the present invention is in the technical field of stability measurements of an alternating current (a.c.) power grid.

Every a.c. power grid has a nominal fundamental frequency, such as 50 Hertz or 60 Hertz. Every a.c. power grid has a nominal fundamental period, which is a time that is the inverse of the frequency: 20 milliseconds fundamental period for 50 Hertz, 16.667 milliseconds for 60 Hertz.

Every section of an a.c. power grid has a nominal voltage, which is the 'name' or approximate expected voltage, such as 120 volts, or 230 volts, or 24 kilovolts. Each physical location on an a.c. power grid also has an actual voltage, which is the voltage that is present at that location at a particular instant in time, for example 129.374 volts or 23.878 kilovolts. Due to changes in load, changes in grid impedance, and changes in generation, the actual voltage at any location is not constant. In almost any practical grid, in the actual voltage at any location we find a phenomena we will call a 'background voltage variation' that, over a period of a few seconds, will cause the actual voltage to change. Such changes can be 500 parts per million (500 PPM, or 0.05%) or more.

Traditionally, a.c. power grids move a.c. energy from a spinning electro-mechanical generator to a large collection of geographically dispersed end-use loads. A typical generator converts a supply of thermal or hydro-electric energy into a.c. energy.

In traditional a.c. power grids, energy flows through the a.c. power grid in one direction: from the generator to the end-use loads.

Traditional end-use loads were both linear and straightforward, such as motors, lights, and heaters.

The current drawn by the loads causes the actual voltages at all locations on an a.c. grid to change. For example, if the current in a house abruptly increases because a refrigerator compressor motor turns on, the voltage in the house will abruptly decrease, sometimes causing lights to dim slightly. The magnitude of the change in voltage is determined by the magnitude of the change in current and the source impedance of the a.c. grid at that location.

In modern a.c. power grids, inverters are also used to generate a.c. electric power. When attached to an a.c. grid, an inverter is effectively a generator. 'Inverters' are electronic devices that convert direct current (d.c.) power into a.c. power. In a modern a.c. grid, generators such as fuel cell inverters, battery inverters, and photovoltaic solar inverters, can be found attached directly to the grid, which can cause energy to flow in unexpected directions on these portions of the grid.

Further, the inverters contain electronic or software control loops that help them track and match the frequency and voltage of the a.c. grid to which they are attached. Different inverters can have different time constants built into their control loops, and when two or more such inverters are connected to the same grid, the control loops in the inverters can oscillate against each other, oscillate in unison, or become otherwise unstable. This effect is particularly pronounced during transitory step changes in voltage or frequency on the a.c. power grid to which they are attached.

Further, unlike traditional spinning electro-mechanical generators, inverters have no rotational inertia, and thus are inherently less stable.

In modern grids, an increasing proportion of loads, such as variable frequency drives and electric vehicle chargers, have intentional or unintentional feedback loops that adjust their current consumption from the grid based on voltage changes on the grid.

Modern grids can possibly become unstable, in some cases because of interactions between control loops in inverters and control loops in modern loads. To avoid these instabilities, on many a.c. power grids, limits have been placed on the amount of inverter-supplied power. These limits can restrict the deployment of useful technologies, including solar power and wind power. These limits are based on simulations and rules of thumb, not real world real-time measurements, in part because it is difficult to directly measure the stability of a power grid. These simulations and rules of thumb can be less than accurate because the stability characteristics of a grid often change rapidly, when, for example, the sun comes out from behind a cloud, or a collection of electric vehicle chargers activate. In addition, stability of modern electric a.c. power grids and connected devices are difficult to characterize during steady-state conditions.

For these reasons, among others, it would be useful to have tools to actively and precisely perturb a.c. power grids and then measure and characterize the stability of an a.c. power grid, while it is operating in real time.

Many of the economically valuable loads that are supplied by an alternating current power grid, including bank computers, automated teller machines, cash registers, telecommunication switches, and the like, are, from an power grid perspective, sensitive loads: they can be disrupted by abrupt changes in actual grid voltage, waveform, or the like. For example, international Standards such as IEC 61000-4-30, published by the International Electrotechnical Commission, and IEEE 519, published by the International Electrical and Electronic Engineers, and SEMI F47, published by the Semiconductor Equipment Manufacturers Institute, all suggest that sensitive equipment can tolerate a brief 10% reduction in actual voltage, but no more. (The first named inventor on the present application has served as the Chair of all three of these Standards.)

It would be useful to measure the stability of an a.c. power distribution grid without disrupting these sensitive loads.

It is well known in the prior art that one can measure the stability of any system that contains one or more control feedback loops by stimulating the system with an impulse, while observing the system output before, during, and after the impulse stimulation. Often, one or more damped oscillations can be observed in the system output. The frequency or frequencies of those oscillations can provide useful information about stability risks in the system, and the damping can be a useful measure of the system stability. Damping is the length of time, or number of oscillations, it takes for the system to return to a steady state output, if it ever does. For example, a child sitting on a swing has a feedback loop. The further the child is moved away from the centered, stable, hanging position, the more force is available to move the child back to the center position. The feedback loop has damping, primarily in the mechanical friction of the swing's bearings. The child's swing system has a resonant frequency, too. The resonant frequency and the damping can be observed and measured simply by applying an impulse to the system, i.e. pushing the child once. The resonant frequency of the system can be observed by timing the swing's subsequent oscillations. The damping of the system can be observed by measuring the time that elapses before the swing returns to its steady-state position, hanging straight down (and the child, finding the steady state somewhat boring, asks to be pushed again).

SUMMARY OF THE INVENTION

The present invention measures the stability of an alternating current power distribution grids by stimulating the grid with a series of current impulses that are both sufficiently small that they do not disrupt sensitive loads connected to the grid, while simultaneously having novel time synchronizing characteristics that allow a measurement system to extract the voltage effects of the current impulses from the background voltage variation, then use those effects to measure the stability of the grid.

SUMMARY OF PRIOR ART

Applying an impulse stimulation of a system, and measuring the response to the impulse of the system in order to determine characteristics of the system, is well known. For example, Kovak et al., in the context of the Apollo 16 landing on the moon, (NASA Document ID 19730013015) disclose an active seismic experiment that set off a small explosive on the lunar surface, an impulse stimulation, then measured the response to determine certain characteristics.

Shelton et al. in "Bonneville Power Administration 1400-MW braking resistor" disclose stability measurements on the Western Interconnect grid, made by applying an impulsive load. However, Shelton et al produce a huge variation in the grid voltage, and make no attempt to avoid disrupting sensitive loads. Consequently, the Shelton method is not practical for making real-world in-situ measurements of active a.c. power distribution grids, as it would disrupt economically valuable loads.

Byrne et al in "Renewable Source Controls for Grid Stability" recognizes the problem of grid stability, in the context of inverters driven by renewable energy sources such as photovoltaic solar arrays, but unlike the present invention makes no suggestions of how to measure grid stability.

In US20120226385A1, "Method and apparatus for controlling electrical loads to provide positive damping of power grid oscillation", Williams provides an excellent overview of power grid oscillations, but unlike the present invention makes no suggestions about how to measure power grid stability in-situ without disturbing sensitive loads.

In U.S. Pat. No. 7,116,010B2, "Control of small distributed energy resources", Lasseter and Piagi recognize the DER (distributed energy resources, i.e. inverters) challenges of transient stability to the grid: " . . . the system's steady-state and transient stability cannot be achieved using methods developed over time for synchronous generators." but makes no suggestion about how to measure the stability challenges.

In US20070241759A1, "Method for measuring stability margin at a node of a polyphase power grid" Williams measures the stability of a grid, but unlike the present invention, Williams requires control over a pre-existing generator on the grid, which is difficult to obtain. Also, Williams is concerned with the upstream and downstream impedances from that generator, as opposed to the present invention which is concerned with the overall stability of a grid.

In US20130204557A1, "Electric Power Grid Monitoring Methods And Apparatus", Trudnowski et al " . . . provide information regarding an oscillatory mode within the electric power system." However, they provide no information about the measuring stability of an operating power grid without disturbing sensitive loads, the subject of the present invention.

In EP2728697A3, "Electrical power system stability optimization system", Fu et al consider the stability of an electric power microgrid, with a focus on an airplane's power system. Their invention discloses a way to simulate in software such a stability question, but, unlike the present invention, their invention cannot be used to measure the stability of an existing power system, only to simulate the stability of a proposed system.

DETAILED DESCRIPTION OF THE INVENTION

Figure 1:
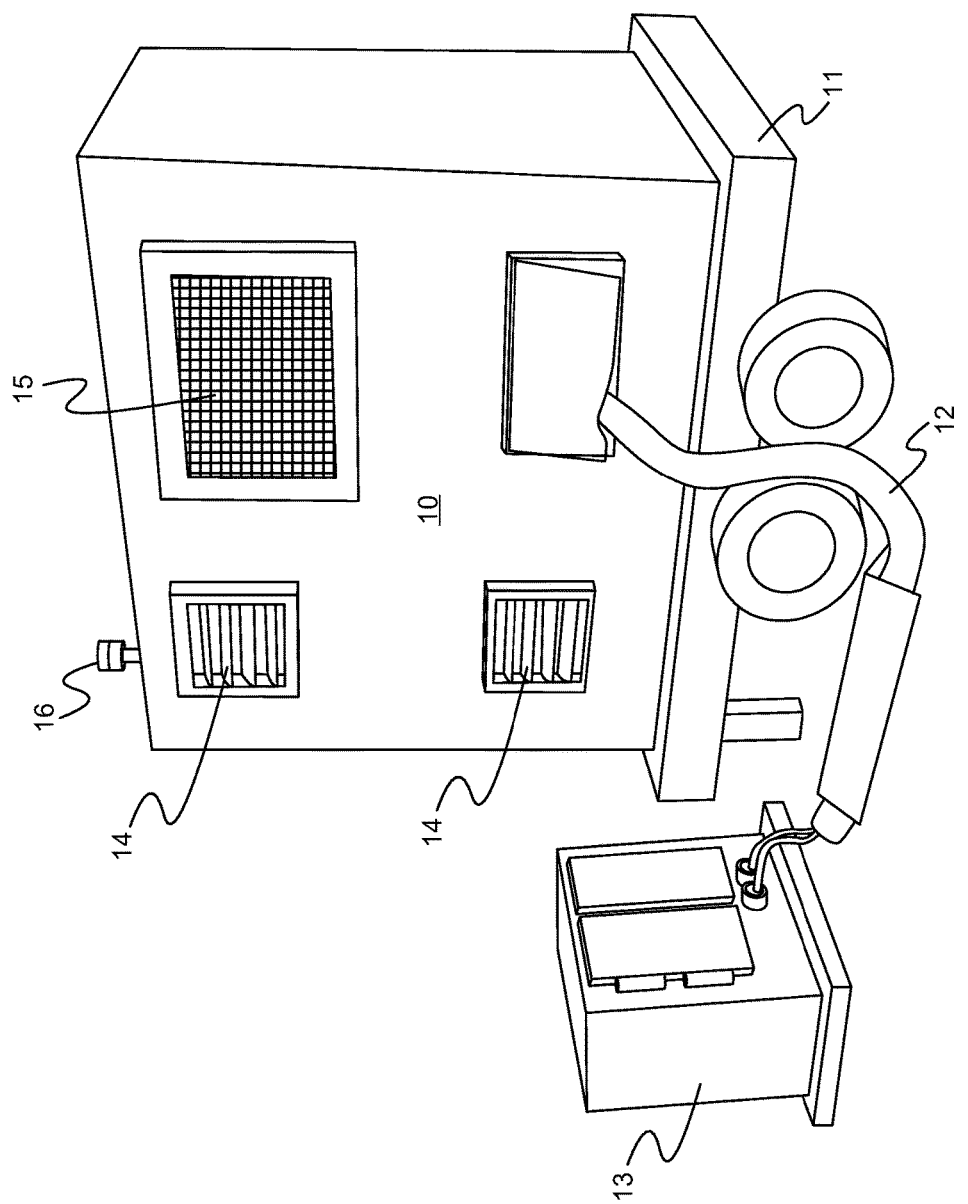
FIG. 1 is a thumper, one element of the present invention.

Turning our attention to FIG. 1, we see a key element of the present invention, a device we will refer to as a 'thumper' 10. The thumper 10 is coupled to a local a.c. power grid, for example to a pad mount transformer 13, via a power cable 12. Inside the thumper 10, a programmable controller can configure and couple various sizes of loads to the a.c. power grid in a way that causes the thumper 10 to draw current pulses from the a.c. power grid, as will become clear when we examine the thumper schematic in FIG. 4. When the loads are coupled to the a.c. power grid, significant heat can be generated inside the thumper 10. Preferably, outside air is pulled through vents 14 to provide cooling. Experiments show that a power draw through the thumper 10 of up to 1 megawatt or more (1,000,000 watts) can be useful. As a result, the switches and electronics inside the thumper can find cooling 15 useful.

The coupling of the loads in the thumper 10 is preferably synchronized to induce perturbations on the a.c. power grid at predetermined times. In the preferred embodiment, a precision timing satellite receiver 16 allows the thumper to synchronize the current pulses with so-called absolute time as established by GPS satellite timing signals. Experiments show that it is useful to synchronize the current pulses to better than one-half of the period of the a.c. power grid, e.g., with at least a precision of 10 milliseconds on a 50 Hertz grid and at least a precision of 8.333 milliseconds on a 60 Hertz power grid.

Although it is not critical to the present invention, experiments show that it is useful to move a thumper 10 to various locations on the a.c. power grid. As such, it is mounted on a standard trailer 11 and it is constructed in a standard 10 foot long shipping container.

The function of the thumper in the present invention is to stimulate an a.c. power grid with a series of current impulses through a cable 12. The effect on the a.c. power grid of these current impulses on the voltages, throughout the grid, can reveal the stability of the grid.

The invention uses measurements made in synchronization to the current impulses made by the thumper 10. Experiment and simulation shows that, for the purposes of this invention, it is useful to select a voltage measurement device capable of resolving better than 500 parts per million (PPM), or 0.05%, with respect to the nominal voltage of the a.c. power grid. Experiment and simulation also shows that, for the purposes of this invention, it is useful to select a voltage measurement device capable of synchronizing its measurements to absolute time with a resolution of better than one-half of the period of the a.c. power grid, i.e. better than 10 milliseconds on a 50 Hertz grid and better than 8.333 milliseconds on a 60 Hertz power grid. For the purposes of this invention, any prior art voltage measurement device that meets these requirements may be used.

Figure 2:
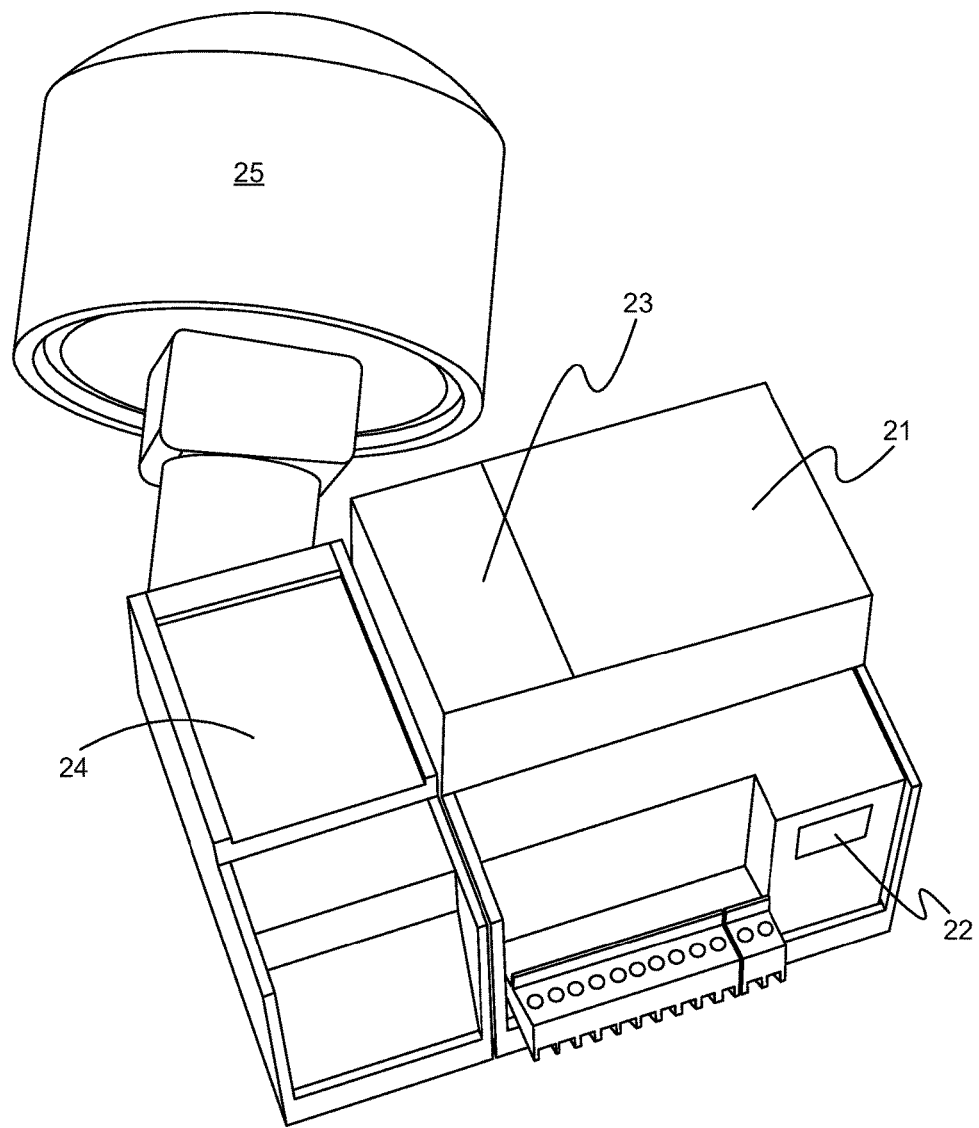
FIG. 2 is a voltage measurement device capable of implementing an element of the present invention.

FIG. 2 shows a prior art voltage measurement device 21, capable of recording a.c. power grid voltage measurements at predetermined synchronous times at a location on an a.c. power grid. In particular, FIG. 2 shows the prior-art instrument used in U.S. Pat. No. 9,621,569 B1, "Method and apparatus for detecting cyber attacks on an alternating current power grid" (the first-named inventor in that patent is also the first-named inventor on the present application) which is the micro-synchrophasor instrument available from Power Standards Lab of Alameda, Calif., USA. Recording on a standard micro-SD card 23, and reporting via a CAT 5 connection 22 using internet protocols, it measures r.m.s. a.c. voltages with a resolution that, when processed properly, is better than 10 PPM. Using a satellite receiver 25 and an appropriate module 24, the prior art voltage measurement device 21 synchronizes its measurements to absolute time to better than 1 millisecond.

Figure 3:
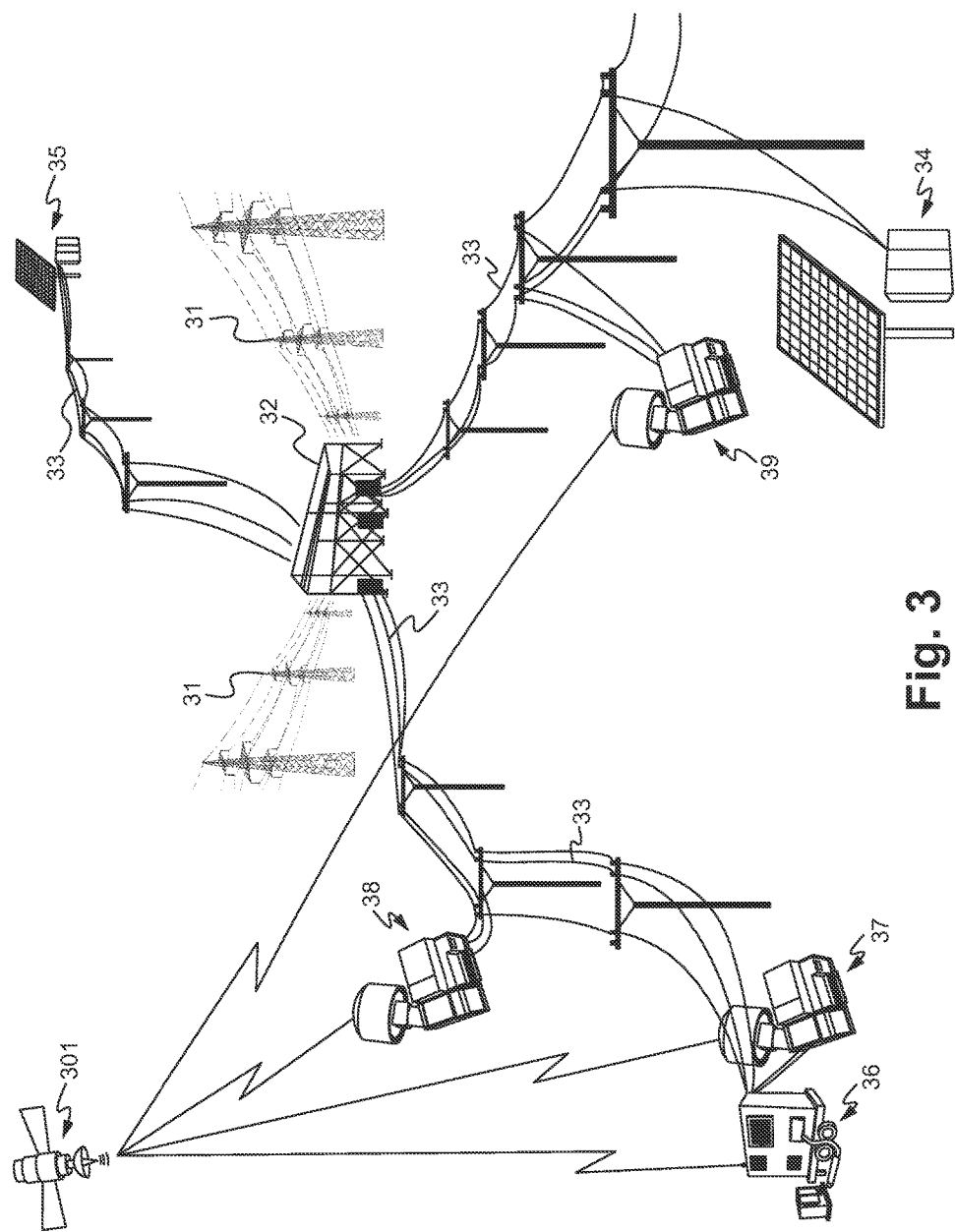
FIG. 3 shows simplified schematic arrangement of the present invention when the thumper of FIG. 1 and the measurement devices of FIG. 2 are deployed on an a.c. power distribution grid.

FIG. 3 is a sketch that shows a high voltage transmission system 31 coupling to a substation 32, in the conventional way. The substation 32 steps the voltage down, then sends it out towards loads on several distribution grid feeders 33. (One familiar with the art will recognize that the sketch in FIG. 3 shows the common radial configuration of a distribution grid, but the invention applies equally to the well-known radial, loop, and network grid configurations.) At the end of one of the feeders 33 we see a thumper 36 of FIG. 1 and a co-located voltage measurement device 37. In FIG. 3 two other voltage measurement devices 38, 39 are also coupled to the a.c. power grid but are not co-located with the thumper 36. Experiment and simulation shows that it is useful to co-locate one voltage measurement device 37 with the thumper 36, and to locate at least one additional voltage measurement device 38, 39 at some distance away from the thumper 36. Preferably, the distance of the at least one additional voltage measurement device 38, 39 is at least 10 meters or more. Inspecting further, we see two photovoltaic systems 34, 35 are coupled to the a.c. power grid through their inverters 34, 35. These inverters 34, 35 are a potential source of grid instability as discussed earlier. Finally, an orbiting timing satellite 301, provides synchronizing timing signals to the thumper 36 and to the voltage measurement devices 37, 38, 39. In some embodiments the orbiting timing satellite 301 can be a GPS satellite.

Figure 4:
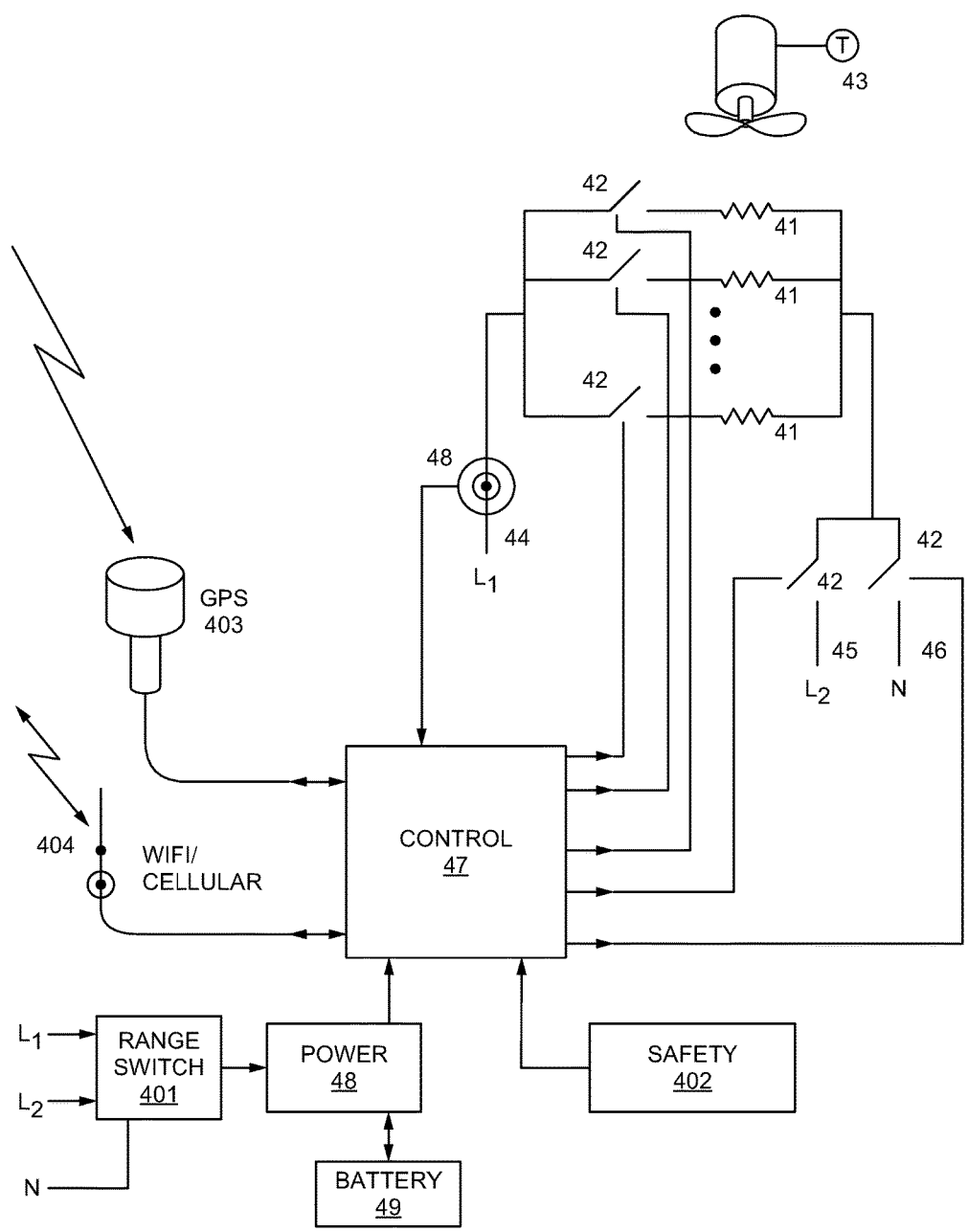
FIG. 4 shows a simplified electrical schematic of the thumper shown in FIG. 1.

FIG. 4 shows a simplified schematic and block diagram of the thumper 10 shown in FIG. 1. There are a set of loads 41 that can be coupled to the a.c. power grid, with heavy current carrying conductors, from one of the power distribution grid phases 44, indicated in the conventional way by 'L1', to either a second phase 45 indicated in the conventional way by 'L2' or to neutral 46 on the power distribution grid, depending on the configuration of the power distribution grid and the nature of the experiment. (It will be clear to one familiar with the art that the simplified schematic of FIG. 4 shows a single set of loads 41 that are for L1, but that the thumper 10 in FIG. 1 is actually constructed with three similar sets of loads, one for L1, one for L2, and one for L3 on a three-phase system.)

FIG. 4 shows that there is a control box 47, that is configured to operate the switches 42 that control the configuration and coupling of the loads 41. The switches 42 can be any type of switch known in prior art that is capable of being controlled by logic signals from the control box 47, and capable of switching grid-scale voltages, and capable of switching appropriate amount of currents to supply the loads 41. In our experiments, we used a maximum of 600 volts r.m.s. as the grid voltage, and a maximum of 1000 amps as the rated load current for the switches 42. For example, prior-art switches capable of meeting these requirements, constructed from Insulated Gate Bipolar Transistors (IGBT's) or from triac semiconductor devices, were disclosed by the first-named inventor in the present application, in U.S. Pat. No. 6,759,765 "Sag generator with plurality of switch technologies".

FIG. 4 shows that the control box 47 is preferably equipped with a power supply 48 that includes both a battery backup 49 and a range switch 401 that permits operation from a wide range of distribution grid voltages. A temperature-controlled fan 43 is important in operation, but not critical to the present invention, when the loads are configured for several hundred thousand watts. Alternatively, the fan 43 can be run whenever the thumper 10 runs, or can be run before, and/or after the thumper 10 runs. The control box 47 has access to current measurement probes 48 that are preferred in operation but not critical to the present invention. The control box 47 has access to safety signals 402 that are preferred in operation but not critical to the present invention. Such safety signals 402 include over-temperature, smoke detection, intruder alerts, battery state, circuit breaker status, and the like.

Finally, in FIG. 4 two elements of the present invention include a synchronization means, preferably a GPS satellite receiver 403 is coupled to the control box 47 to synchronize its load current pulses to absolute time. Preferably a WiFi/Cellular connection 404 is also coupled to the control box 47 as a communication means that allows programming of the timing, configuration, and coupling of the loads 41 prior to commencement of a test event.

Figure 5:
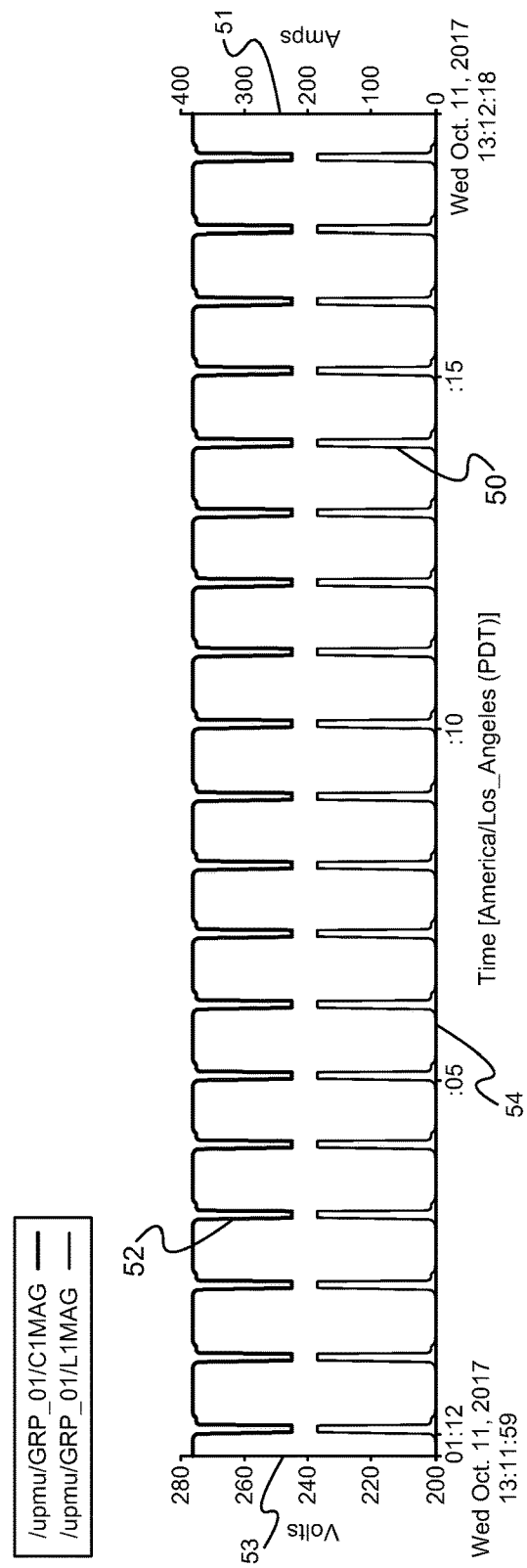
FIG. 5 is a graph of programmable current pulses drawn by a thumper, and the corresponding actual voltage, as recorded by a measurement device 37 co-located with a thumper 36.

FIG. 5 shows a recording of voltage (and current) levels is made by the voltage measurement device 37 of FIG. 3 that is collocated with the thumper 36 of FIG. 3. The horizontal axis 54 in FIG. 5 shows time, and covers an interval of approximately 20 seconds. The repetitive current pulses 50, and their scale 51 are shown at the right end of the graph. Each repetitive current pulse has been programmed to be a little less than 200 amps, endures for about 0.1 seconds, and repeats every second, starting exactly on the second after this experiment.

The voltage magnitude 52, measured on the left axis 53, is clearly affected by the current pulses. (Because this voltage measurement device 37 is co-located with the thumper 36, the voltage effects are large enough to be visually observable. But at distant measurement devices 38, 39 shown in FIG. 3, the voltage effects are extracted from the measurements using knowledge of the timing of the current pulses to average out the background variation in voltage which is generally much larger than the voltage effects of the current pulses.) The voltage magnitude 52 decreases for a tenth of a second from about 270 volts to about 250 volts, less than a 10% change, so sensitive loads are unlikely to be affected by this test.

Figure 6:
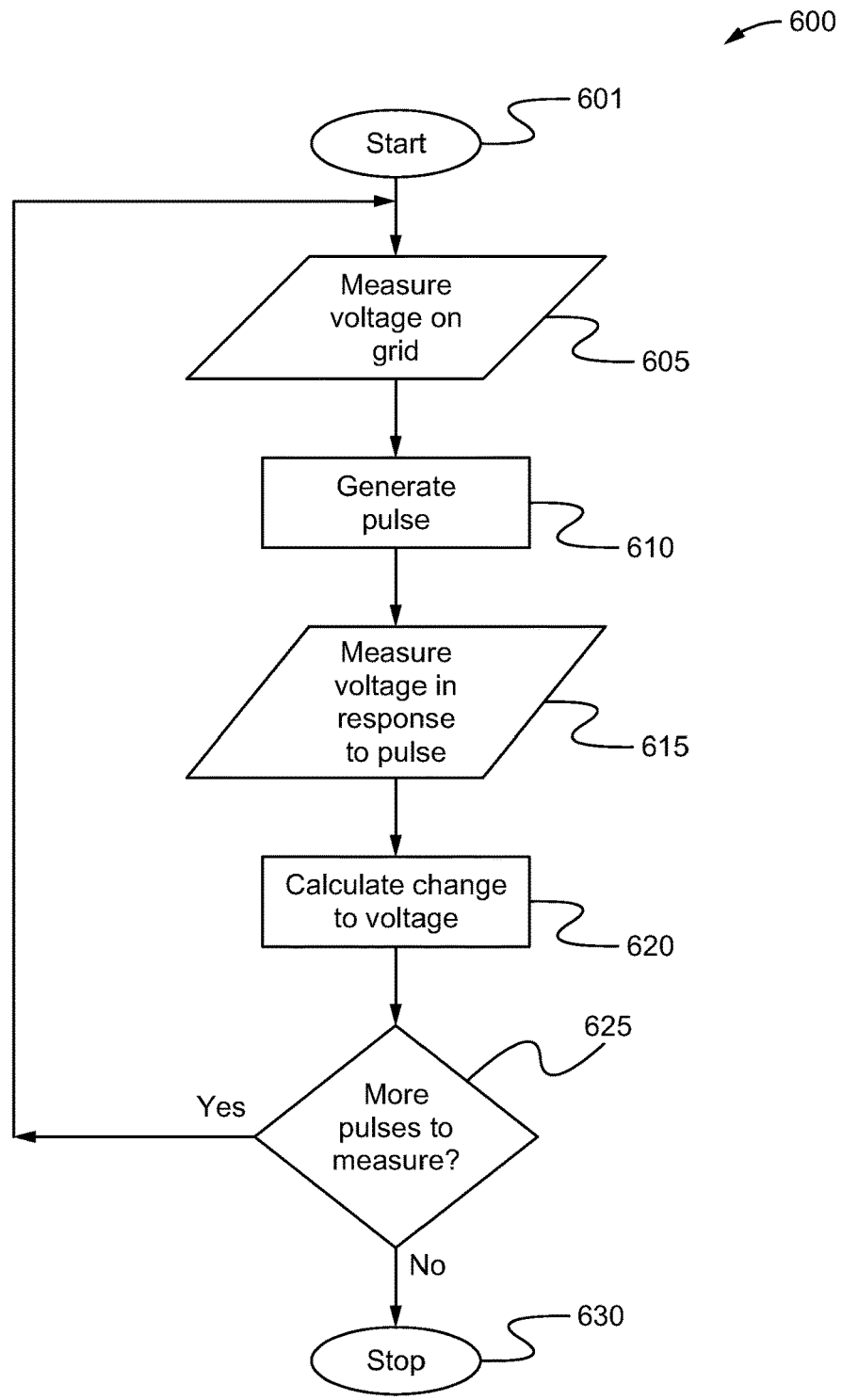
FIG. 6 is a flow chart of the steps for generating voltages and measuring changes in the voltages at a thumper in accordance with one embodiment of the invention.

FIG. 6 is a flow chart of the steps of a process 600 for generating voltages and measuring changes in a voltage at a thumper coupled to a grid in accordance with one embodiment of the invention. The process starts in the step 601. Next, in the step 605, a voltage is measured on the grid. Next, in the step 610, a current pulse is generated on the thumper to couple a load on the grid, generating a voltage in response to the current pulse. In the step 625, the voltage in response to the current pulse is measured. Next, in the step 620, the difference between the voltages is measured. In the step 625, it is determined whether more pulses are to be generated. If so, the process loops back to the step 605. Otherwise, the process continues to the step 630, where it ends.

Figure 7:
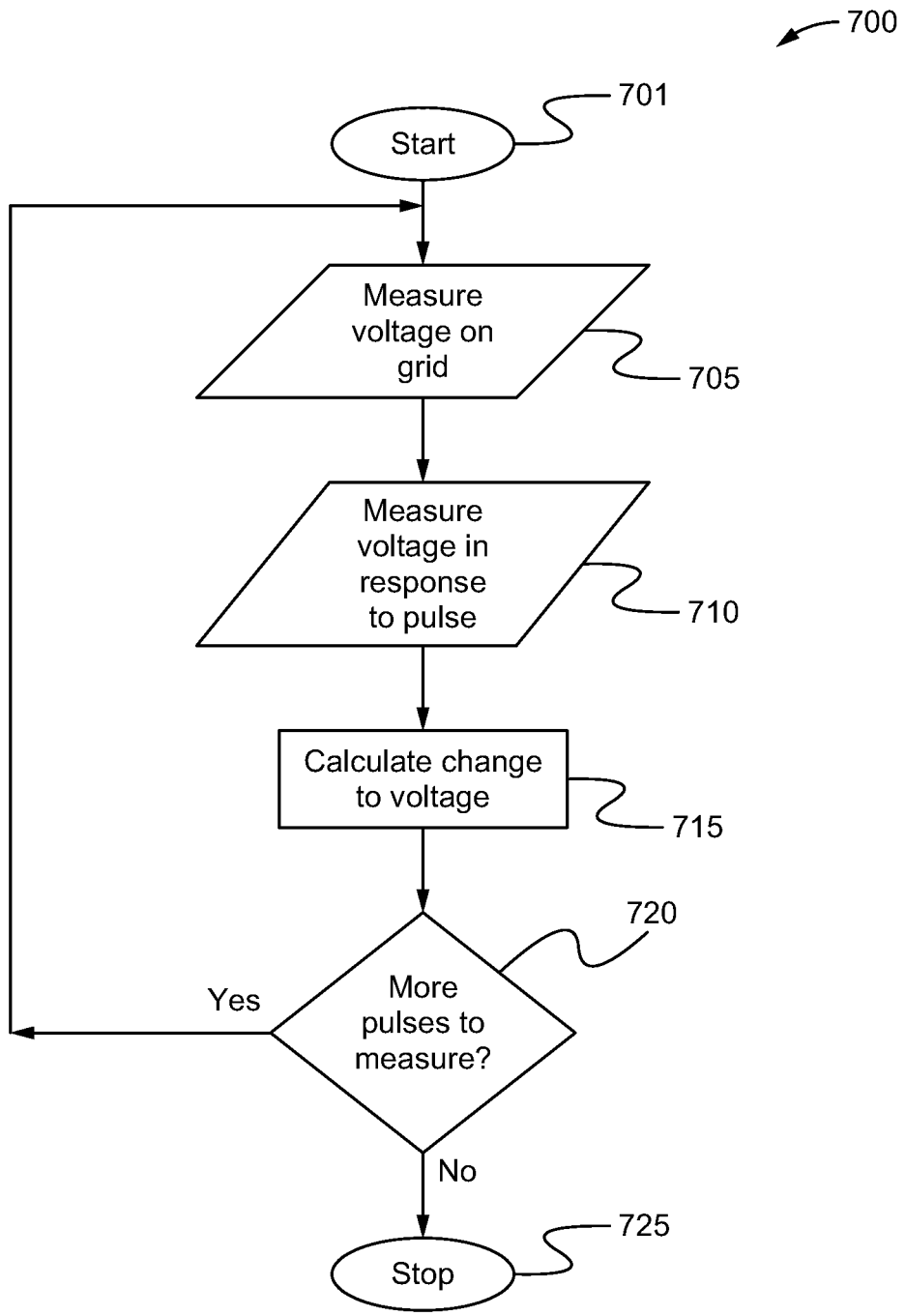
FIG. 7 is a flow chart of the steps for measuring voltages and changes in the voltages at locations in a grid removed from a thumper in accordance with one embodiment of the invention.

FIG. 7 is a flow chart of the steps of a process 700 for measuring voltages and changes in voltages at locations on a grid removed from a thumper, in accordance with one embodiment of the invention. Though the process 700 is shown for one location, it will be appreciated that the process 700 is able to be performed at multiple locations. The process starts in the step 701. Next, in the step 705, a voltage is measured on the grid. Next, in the step 710, a voltage is measured in response to the current pulse generated in the step 610 of FIG. 6. Next, in the step 715, a difference between the voltages is calculated, where the change is a function of grid stability. In the step 720, it is determined whether more changes in the voltage in response to the current pulse are to be measured. If so, the process loops back to the step 705. Otherwise, the process continues to the step 725, where it ends.

OPERATION OF THE INVENTION

To measure the stability of a grid without disrupting sensitive loads, the thumper applies a current pulse to the a.c. power grid, which functions as an impulse applied to the system. Preferably, this forms the largest possible stability signal to maximize the observability by the voltage measurement devices, but not so large a stability signal that it can disrupt sensitive loads.

The control box 47 in the thumper 36 is programmed to generate small current pulses of 10 amps or less, while measuring through the co-located voltage measurement device 37 exactly how much the actual voltage magnitude at this location decreases during the current pulse. If, during the current pulse, it does not fall below some predetermined voltage threshold, typically 95% of the nominal voltage, the control box 47 generates a larger set of current pulses, then repeats the process until the measured voltage falls below the predetermined voltage threshold during the current pulse. In this way, a testing current magnitude is selected that is as large as possible while at the same time ensuring that it will not disrupt sensitive loads. By experiment, it is shown that the test current magnitude selected in this way varies substantially depending on the location where the thumper 36 is installed. At some locations, 15 amp current pulses are sufficient to generate a potentially disruptive voltage magnitude for sensitive loads; at other locations, 500 amps or more can be drawn without generating potentially disruptive voltage magnitude for sensitive loads.

After selecting a testing current magnitude, the control box 47 in the thumper 36 is programmed to generate a repetitive series of current pulses at that testing current magnitude. Experiments show that at least 10 repetitive current pulses are necessary to provide sufficient data to separate the voltage effects, caused by the repetitive current pulses, measured at the distant voltage measurement devices 38, 39 from the background voltage variation, discussed above, at their locations, and in some experimental cases we have observed that it is useful to have as many as 18,000 repetitive pulses to effectively separate the voltage effects from the background voltage variation.

The control box 47 generates the repetitive current pulses at times that are synchronized to the absolute time. For example, the repetitive pulse could be programmed to start each current pulse at the beginning of each second of absolute time, and end it one-tenth of a second later.

Voltage measurements are recorded by the voltage measurement devices. In the example described above, measurements are made during the one-tenth of a second before each repetitive pulse and then during the repetitive pulse. It will be readily apparent to one of ordinary skill in the art that different periods, different durations and different configurations for the measurements can be made. Any perturbation caused by the repetitive pulses as well as the stability of the a.c. power grid will be shown from the changes in measured voltage from the portion prior to the pulse and portion during the pulse. The data of interest is extracted representing the voltage effects of the repetitive current pulses, from the background voltage variation, which experiment shows is typically more than an order of magnitude larger than the data of interest, by taking advantage of, first, knowing exactly when the current pulses occurred; and second, by averaging together the effects of repetitive pulses, effectively filtering out the non-repetitive background voltage variation.

The data of interest, the voltage effects of the repetitive current pulses, can then be examined in the conventional ways for determining the stability response of a system when an impulse is applied to it.

It will be apparent to one of ordinary skill in the art that the loads 41 shown in FIG. 4, although illustrated as resistive loads, could usefully be capacitive, inductive, and/or non-linear loads.

It will be apparent to one of ordinary skill in the art that the necessary time synchronization between the thumper 36 current pulses and the voltage measuring devices 37, 38, 39 could be accomplished by means other than GPS time synchronization, including stable crystal oscillators that are initially synchronized, NTP (network time protocol) implementations, synchronization signals sent between the thumper 10 and the voltage measuring devices 37, 38, 39 through any well-known communication channel, radio synchronization signals such as WWV, or any other means that can synchronize non-co-located devices to better than one-half period of the power distribution grid.

It will be apparent to one of ordinary skill in the art that, although this disclosure illustrates a single synchronized thumper applied to an a.c. power distribution grid, additional stability information could be extracted from multiple synchronized thumpers applied simultaneously or in succession at multiple locations on an a.c. power distribution grid.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

We claim:

1. A system for measuring the stability of an alternating current power distribution grid comprising:
   a) a first circuit coupled to the grid for drawing a plurality of current pulses from the grid;
   b) a first measuring device co-located with the first circuit, coupled to the grid for measuring a first voltage on the grid prior to each of the pulses and for measuring a change to the first voltage in response to each pulse; and
   c) a plurality of second measuring devices, each a corresponding distance from the first circuit, coupled to the grid for measuring a second voltage on the grid prior to each of the pulses and for measuring a change to the second voltage in response to each pulse, wherein the changes are a function of stability of the grid, and the drawing the plurality of pulses and the measuring the first and second voltages are synchronized to a synchronization timing signal.

2. The system according to claim 1 further comprising a controller for synchronizing the first circuit with the first measuring device and the plurality of second measuring devices.

3. The system according to claim 2 wherein a timing satellite provides the synchronization timing signal to the first circuit, the controller, the first measuring device and the second measuring devices.

4. The system according to claim 2 wherein a timing satellite provides the synchronization timing signal to the first circuit, the controller, the first measuring device and the second measuring devices.

5. The system of claim 1, wherein the plurality of current pulses are selected to avoid disrupting loads on the grid.

6. The system of claim 5, wherein the plurality of current pulses are configured as the largest possible stability signal to maximize observability of second voltages by the plurality of second measuring devices.

7. The system of claim 5, wherein a total number of the plurality of current pulses is sufficient to separate voltage effects caused by the plurality of current pulses at each of the second measurement devices from a corresponding background voltage variation.

8. The system of claim 5, wherein the synchronization timing signal synchronizes the second measuring devices to within a time resolution of less than a fundamental period of the grid.

9. A system for measuring the stability of an alternating current power distribution grid comprising:
   a) a first circuit coupled to the grid for repeatedly and selectively coupling a load to the grid for forming a plurality of current pulses on the grid;
   b) a first measuring device co-located with the first circuit, coupled to the grid for measuring a first voltage on the grid prior to each of the pulses and for measuring a change to the first voltage in response to each pulse; and
   c) a plurality of second measuring devices, each a corresponding distance from the first circuit, coupled to the grid for measuring a second voltage on the grid prior to each of the pulses and for measuring a change to the second voltage in response to each pulse, wherein the changes are a function of stability of the grid, and the forming the plurality of pulses and the measuring the first and second voltages are synchronized to a synchronization timing signal.

10. The system according to claim 9 further comprising controller coupled for synchronizing the first circuit with the first measuring device and the second measuring devices.

11. The system according to claim 9 further comprising a programmable digital controller for synchronizing the first circuit with the first measuring device and the plurality of second measuring devices.

12. The system according to claim 9, wherein the synchronization timing signal is provided by a timing satellite, a stable crystal oscillator, or a network time protocol implementation.

13. The system of claim 9, wherein the plurality of current pulses are selected to avoid disrupting loads on the grid.

14. The system of claim 13, wherein the plurality of current pulses are configured as the largest possible stability signal to maximize observability of second voltages by the plurality of second measuring devices.

15. The system of claim 13, wherein a quantity of the plurality of current pulses is sufficient to separate voltage effects caused by the plurality of current pulses at each of the second measurement devices from a corresponding background voltage variation.

16. The system of claim 13, wherein the synchronization timing signal synchronizes the second measuring devices to within a time resolution of less than a fundamental period of the grid.

* * * * *